United States Patent [19]
Reynolds

[11] 4,211,466
[45] Jul. 8, 1980

[54] CRIMPED ELECTRICAL CONNECTIONS FOR CONDUCTORS ON THIN SUBSTRATES

[75] Inventor: Charles E. Reynolds, Mechanicsburg, Pa.

[73] Assignee: AMP Incorporated, Harrisburg, Pa.

[21] Appl. No.: 962,736

[22] Filed: Nov. 21, 1978

[51] Int. Cl.² .................. H01R 13/54; H05R 1/12
[52] U.S. Cl. ...................... 339/176 MF; 339/17 F; 339/276 SF
[58] Field of Search ............... 339/17 F, 176 MF, 98, 339/99, 97 R, 97 C, 210 R, 210 M, 276 SF; 200/5 A

[56] References Cited

U.S. PATENT DOCUMENTS

| | | | |
|---|---|---|---|
| 3,891,293 | 6/1975 | Jones | 339/97 C |
| 3,897,130 | 7/1975 | Donnelly et al. | 339/176 MF |
| 3,989,336 | 11/1976 | Rizzio et al. | 339/17 F X |
| 4,160,573 | 7/1979 | Weisenburger | 339/99 R |

FOREIGN PATENT DOCUMENTS 948391  2/1964  United Kingdom ............. 339/176 MF

OTHER PUBLICATIONS

Fold Switch, R. H. Harris, IBM Technical Disclosure Bulletin, vol. 19, No. 10 (Mar. 1977) p. 3815.

*Primary Examiner*—Roy Lake
*Assistant Examiner*—Eugene F. Desmond
*Attorney, Agent, or Firm*—Frederick W. Raring

[57] ABSTRACT

Electrical connections for conductors on two spaced apart films are provided by means of a strip of connecting devices. The strip comprises a carrier strip with the connecting devices extending therefrom at spaced intervals. Each connecting device has first and second side-by-side crimp portions, each crimp portion being generally U-shaped. The connecting devices are crimped onto the two films by positioning one film between the arms of the first connecting devices of a section of the strip and the second film between the arms of the second connecting devices. The connecting devices are then crimped onto the film and the carrier strip is removed. A housing for the connecting devices is also disclosed.

11 Claims, 7 Drawing Figures

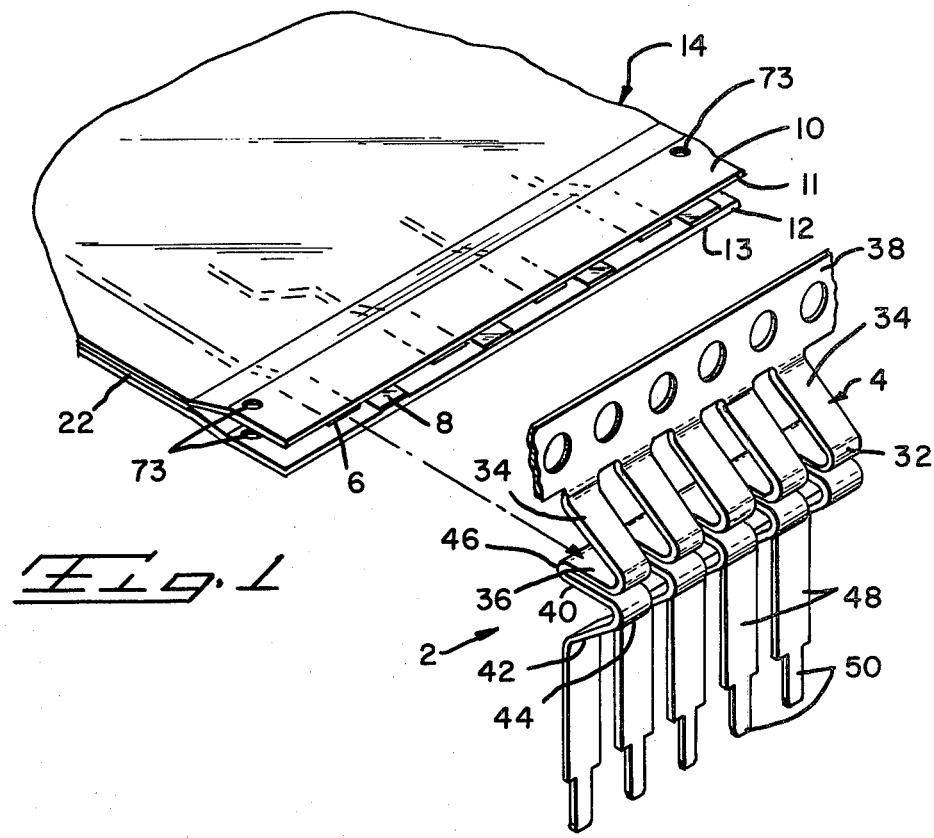
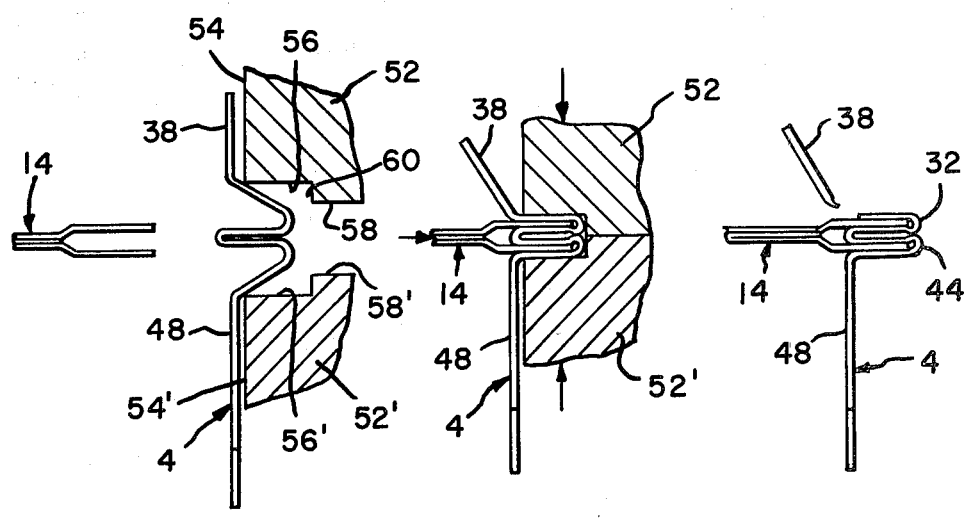

CRIMPED ELECTRICAL CONNECTIONS FOR CONDUCTORS ON THIN SUBSTRATES

DESCRIPTION

1. Technical Field of the Invention

This invention relates to crimped electrical connections for films in parallel spaced-apart relationship. The disclosed embodiment relates to connections for conductors on the films of a membrane switch.

2. Background of the Invention

Application Ser. No. 960,425 filed Nov. 13, 1978 discloses and claims an improved crimped connection for conductors on substrates such as relatively thin films. The conductors may be produced on the films by silkscreening, by electrodeposition, or by etching a laminate comprising a substrate and a sheet of conductive metal to leave the desired conductive paths. In accordance with the teachings of the above identified application, a sheet metal U-shaped device is provided and the edge of the film is positioned between the cantilever beams of the connecting device with the conductor in alignment with one of the cantilever beams. The connecting device is then crimped onto the film by applying diametrically opposite crimping forces to the ends of the cantilever beam until the sides of the beams are against the film. Thereafter, the bight portion of the connecting device is plastically deformed and the cantilever beams are flexed so that in the finished crimped section, they are biased against the film and one of the beams is maintained in electrical contact with the conductor.

Application Ser. No. 790,635 now U.S. Pat. No. 4,143,253, issued Mar. 6, 1979 discloses a membrane switch comprising two spaced-apart films which are separated by a separator film having openings therein at predetermined locations. Conductors are provided on the surfaces of the outside films so that when the switch is pressed at the location of one of the openings, conductors on the outside films will be contacted with each other. The outside films have tail portions which extend beyond the separator film and the conductors extend across the opposed surfaces of the tail portions. Electrical connections are required for the conductors on these tail portions to connect the switch conductors to further circuitry.

The present invention is directed to the achievement of electrical connections to conductors on spaced-apart films with the connections being of the type disclosed and claimed in the above identified Application Ser. No. 960,425.

In accordance with the practice of the present invention, a strip of connecting devices is provided having a carrier strip with the individual connecting devices extending therefrom at spaced intervals. Each connecting device has two crimp portions, each of which is generally U-shaped. The crimp portions are connected at the ends of their adjacent arms and a terminal pin or the like, extends from the free arms of the crimp portion which is remote from the carrier strip. In use, one of the films from the switch is located beween the arms of one of the crimp portions of a strip of terminals and the other film is located between the arms of the other crimp portions of the terminals of the strip. The crimp portions are crimped onto the two films in accordance with the teachings of application Ser. No. 960,425 and the carrier strip is removed so that each conductor is connected to one connecting device. A suitable housing for the tail portion of the strip can also be provided.

DESCRIPTION OF THE DRAWING FIGURES:

FIG. 1 is a fragmentary perspective view of a portion of a strip of connecting devices in alignment with two spaced-apart insulating films having conductors on their opposed surfaces, these films forming part of a switch device shown in FIG. 6.

FIG. 2 is a sectional side view of a pair of crimping dies for crimping an individual connecting device onto two spaced-apart films, this view showing the position of the crimping dies prior to the beginning of the crimping operation.

FIG. 3 is a view similar to FIG. 2 but showing the positions of the parts at the end of the crimping operation.

FIG. 4 is a sectional side view of a crimped connecting device illustrating the removal of a carrier strip.

Figure 5:
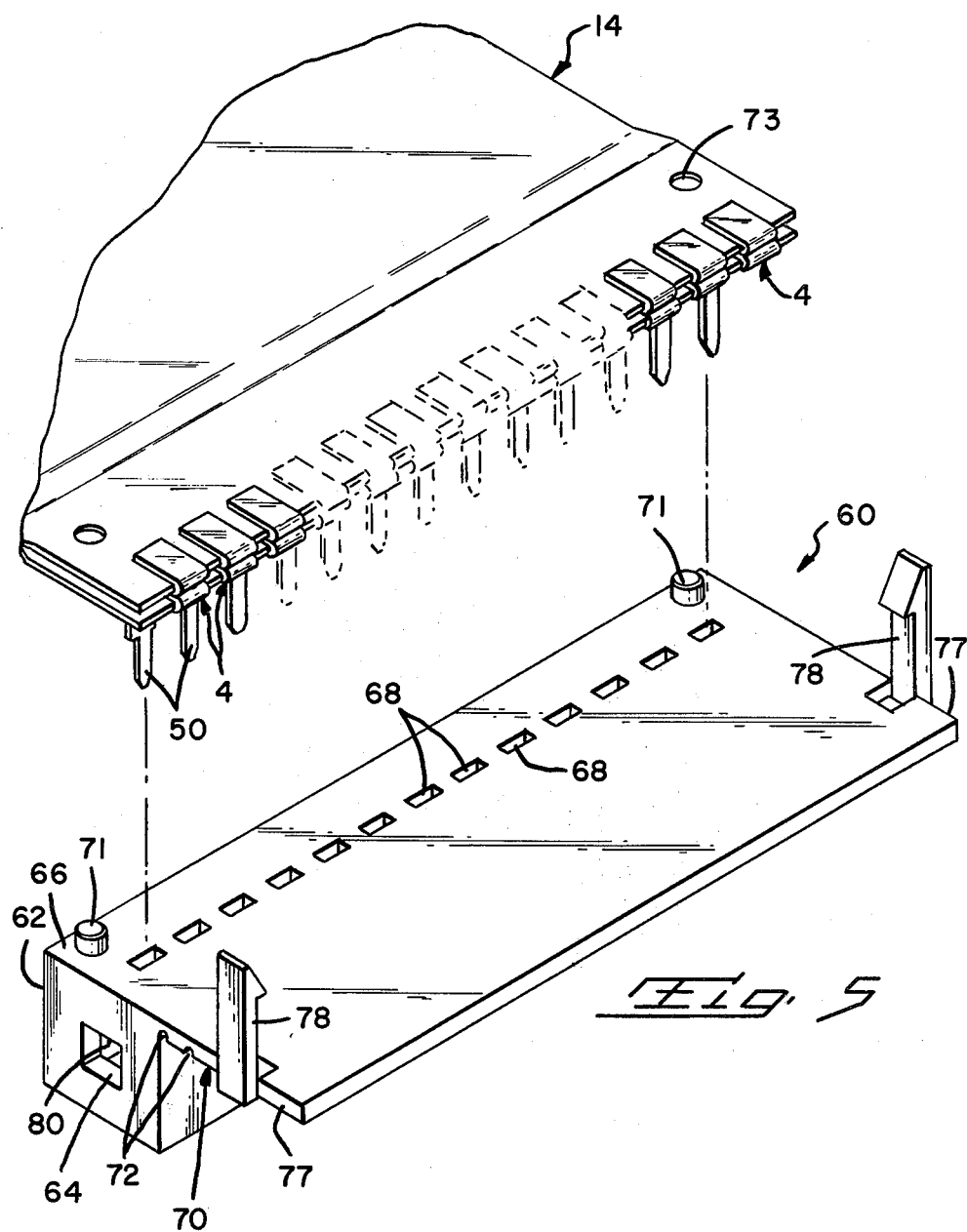
FIG. 5 is a fragmentary view showing connecting devices crimped onto the conductors of the film with the connecting devices in alignment with a connector housing.
Figure 6:
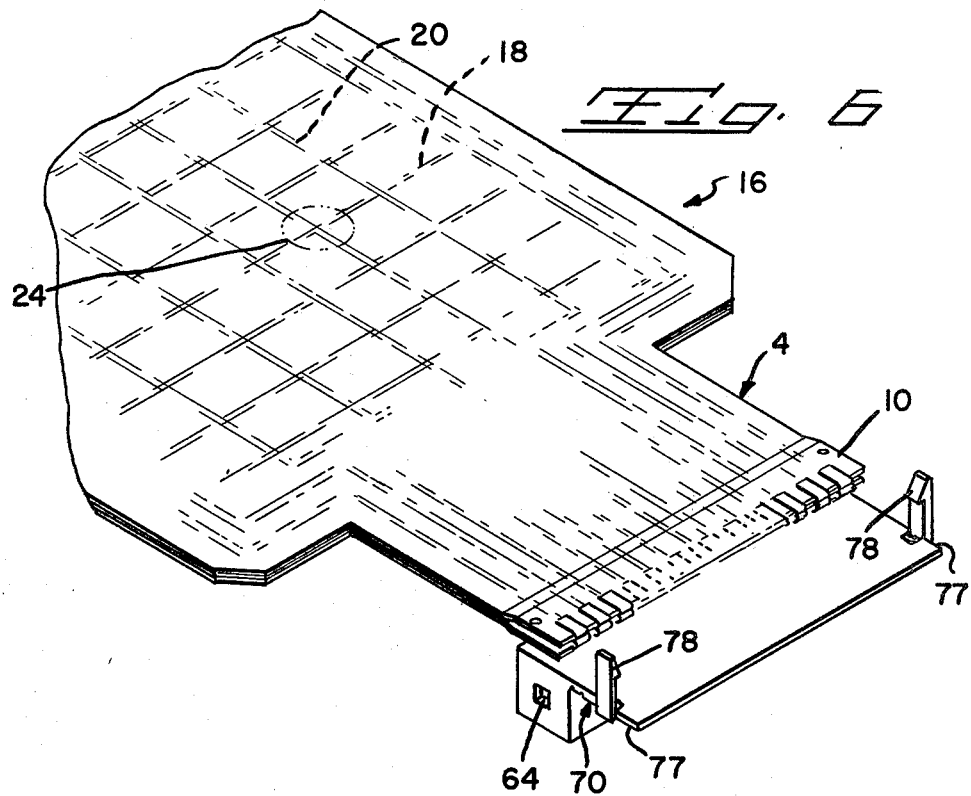
FIG. 6 is a view illustrating the assembly of the connector housing to the films.

PRACTICE OF THE INVENTION:

FIGS. 1–7 show an embodiment of the invention which serves to connect conductors 6, 8 on the opposed surfaces of spaced-apart parallel films 10, 12 to conductors 26 (FIG. 7) on the underside 28 of a circuit board 30. The connecting devices 4 are produced as a continuous strip 2 and are crimped en masse onto the conductors 6, 8 and later assembled to a housing 60. The films 10, 12 are part of the tail portion 14 of a switch 16, FIG. 6, and the conductors 6, 8 extend to switch conductors 18, 20 on the films. These switch conductors extend transversely of each other in the switch portion 16. The two films are separated by, and bonded to, a separator film 22 which has circular holes 24 therein at the locations of the crossing points of the conductors 20, 18. When the surface of the film 10 is pressed at one of the openings 24, the conductors 20, 18 are engaged with each other at that location and the resulting signal is carried to selected conductors 6, 8 in the tail portion 14. As shown in FIG. 1, the separator film 22 does not extend to the edges 11, 13 of the films 10, 12 and the conductors 6, 8 do extend to these edges.

Each connecting device 4 of the strip 2 has a W-shaped double crimp portion at its upper end, the upper crimp portion comprising an arcuate bight 32 having cantilever beams 34, 36 extending therefrom. The end of the beam 34 is integral with a continuous carrier strip 38 and the end of the beam 36 is connected by a sharp reverse bend 46 to a beam 40 of the lower crimp portion. This lower crimp portion has an arcuate bight 44 and a lower cantilever beam 42 from the end of which a contact pin or post 48 extends. This integral pin has a reduced end 50 to facilitate its entry into a connector header described below.

The beams 36, 40 are identified as cantilever beams notwithstanding the fact that their ends are connected by the sharp reverse bend 46. This sharp reverse bend does not appear to affect the functioning of the beams 40, 36 as cantilever beams, as will be described below.

The spacing between adjacent connecting devices 4 on the strip 2 is the same as the spacing between adjacent conductors 6, 8 on the opposed surfaces of the film 10, 12. When a section of strip 4 is positioned between films 10, 12, one of the beams of each connecting device 4 will be in alignment with one or the other of the conductors 6, 8. Thus, if the conductors are spaced apart on each film by a distance 2D, the connecting devices should be spaced apart by a distance D.

A section of the strip 2 is crimped onto the tail portion 14 of the switch by crimping dies, as shown in FIG. 2 at 52, 52'. These crimping dies are mirror images of each other and corresponding structural features are therefore identified by the same reference numerals differentiated by prime marks. The upper die 52 has a front surface 54, a flat crimping surface 56 which extends inwardly from the front surface, and a stop surface 58. The shoulder 60, which is between the surfaces 56, 58, is recessed from the surface 54 by a distance such that the shoulder surface 60 does not engage the bight portions 32 when the connecting devices are crimped. The lower die 52' is normally spaced from the upper die, as shown in FIG. 2, and during crimping the section of strip 2 onto the films, the section of strip is positioned, as shown in FIG. 2, with the carrier strip 38 adjacent to the surface 54 and with the pin portions 48 extending downwardly adjacent to the surface 54'.

To crimp the section of strip 2 onto the films 10, 12, the end portion of the tail of the switch is moved rightwardly from the position of FIG. 2 so that the upper film 10 is between the beams 34, 36 and the film 12 is between the beams 40, 42 with the edges 11, 13 adjacent to the inner surfaces of the bights 32, 44 and with the conductors 6, 8 each in alignment with one of the connecting devices. Thereafter, the dies 52, 52' are moved towards each other to their closed positions as shown in FIG. 3. The upper crimp portion 34, 36 is crimped onto the upper film 10 and the lower crimp portion 40, 42 is crimped onto the lower film 12. After the dies are opened, the carrier strip 38 is removed, as shown in FIG. 4.

As will be explained below, the cantilever beams 34, 36, 40 and 42 are resiliently biased against the films after the crimping operation has been carried out and have no tendency to move away from the films from their positions shown in FIG. 4. Furthermore, the crimping operation illustrated in FIGS. 2 and 3 does not result in the imposition of extremely high compressive crimping forces on the cantilever beams; the maximum crimping forces are rather imposed only on the bight portions 32, 44 so that the possibility of damage to the conductors 6, 8 is minimized.

If desired, the posts 48 can be connected to external conductors directly as by soldering these posts to conductors on a circuit board. In the disclosed embodiment, a molded housing 60, FIG. 5, is provided for the crimped connecting devices and adjacent portions of the films 10, 12. The housing 60 comprises a rectangular body 62 having an opening 64 extending into its underside and having an upper surface 66. Pin receiving opening 68 extends through the body 62 from the upper surfaces 66 to the top wall 80 of the opening 64 so that upon downward movement of the tail portion 14 from the position of FIG. 5, the film 12 will be on the surface 66 and the post portions 48 of the connecting devices will extend through openings 68 and will project downwardly from the surface 80.

Figure 7:
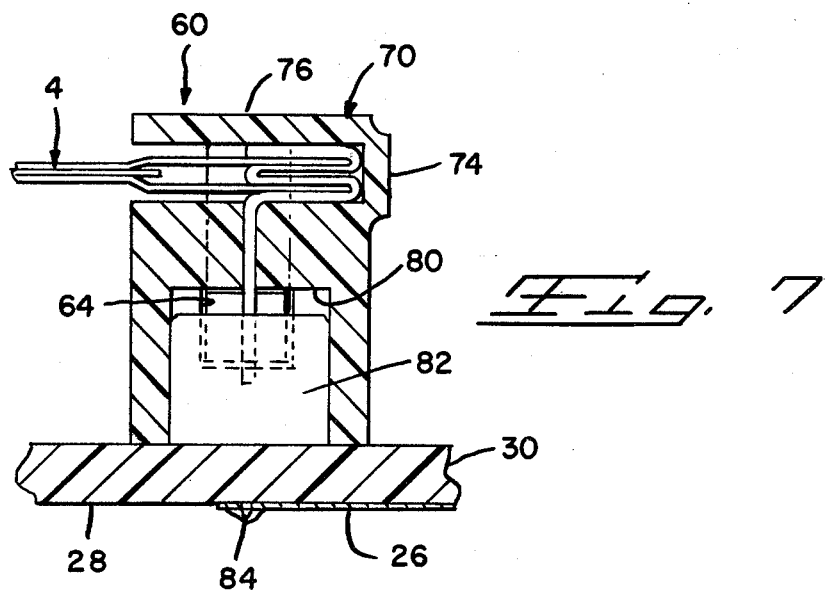
FIG. 7 is a cross-sectional view of the connector housing assembled to the connecting devices and the two films and illustrating the manner in which the crimped connecting devices are mated with a further connecting device on a circuit board.

Housing body 62 has an extension 70 projecting beyond the upper surface 66 and the underside of this projection has spaced-apart channels 72 extending thereacross which function as hinges. The extension 70 can thus be folded, as shown in FIG. 7, so that the portion 74 of the extension between the hinges 72 becomes a sidewall of the housing and the portion 76 becomes a top wall with the end portions of the films 10, 12 contained between this top wall and the surface 66. Latch arms 78 are provided on the side edges 77 of the extension which have hook ends that engage shoulders in the endwall of the housing to hold the top wall against the film 10.

The opening 64 is dimensioned to receive a header 82 (FIG. 7) of the type containing contact terminals which receive the reduced ends 50 of the terminal posts 48. The terminals in the header 82 extend through holes in the circuit board 30 and are soldered, as shown at 84, to the conductors 26 on the underside of the circuit board.

It is desirable to provide a strain relief means between the switch and the housing 60. In the disclosed embodiment, integral pins 71 are provided on the upper surface 66 of the housing which are received in holes 73 in the films 10, 12 so that when a tensile force is applied to either the switch or the housing, the force will be transmitted through the pins and openings and will not be transmitted by the terminals.

The previously identified Application, Ser. No. 960,425 explains the principles of crimped connections of the type preferred for the instant invention and contains a detailed mathematical analysis which permits the achievement of crimped connections having pre-determined contact forces. Reference is made to this previously identified application for such specific details, however, a discussion is presented below, of the salient principles of the crimped connection.

As illustrated in FIGS. 2 and 3, the cantilever beams of each crimp portion are moved towards each other until each film 10, 12 is gripped between the cantilever beams of one of the crimp portions. Thereafter, the die surfaces 56, 56' are moved together an additional distance further to flatten the crimp with accompanying plastic deformation in the bight portions 32, 44. During this final portion of the crimping operation, the cantilever beams of each crimp portion of each terminal device are flexed so that they are resiliently biased against the films, one crimp portion having its beams bearing against one of the films. The cantilever beams of each crimp portion are maintained in their flexed condition by the plastically deformed bight portions 32 and 44 so that stable electrical contact is maintained.

In order to achieve flexure of the cantilever beams of each crimp portion of each terminal against the films, it is necessary to dimension the connecting device such that during the final stages of crimping, when the bight portions 32, 44 are plastically deformed, the dies can travel the distance sufficient to accomplish this plastic deformation of the bight portions. For example, assuming that each crimp portion has an initial radius of curvature R in its bight portion, a beam length L, a material thickness T, and the material has given physical properties, such as strength and elastic modulus, there is a crimp height (the distance between the die surfaces 56, 56') which is reached at an intermediate stage of the crimping operation and at which the ends of the cantilever beams touch the surfaces of the film. It must be possible when this intermediate stage is reached to further crimp the connecting devices so that the beams will be flexed against the surfaces of the film thereby to establish electrical contact in accordance with the invention of the above identified Application Ser. No. 960,425. The material of the terminals must be such that it is capable of undergoing the substantial amount of plastic deformation in the bight portions 32, 44 during this final stage of crimping and the initial radius of curvature R must be such that the terminals can be crimped through this final stage of crimping.

Connecting devices, in accordance with the invention, can be made of any desired size and of many different materials. For example, good results have been obtained by forming the terminals of 0.012" thick brass with the length of the cantilever beams being about 0.080" and the radius of curvature of both bight portions being about 0.020".

If desired, slight projections can be provided on the internal surfaces of the cantilever beams to penetrate a thin film on the conductors and/or to stabilize the terminals, after crimping, against lateral movement relative to the films. In other words, connecting devices in accordance with the invention, can have insulation penetrating means in combination with the resiliently biased and flexed cantilever beams for establishing contact.

I claim:

1. The combination of first and second insulating films having conductors thereon and electrical connecting devices crimped onto said films, said films having parallel spaced-apart edges, said conductors extending to said edges, said conductors on said first film being laterally offset from said conductors on said second film, said electrical connecting devices being characterized in that:
   each of said connecting devices comprises two crimped portions, each of said crimped portions comprising opposed cantilever beams connected to each other by an arcuate bight portion, said two crimped portions being in side-by-side relationship and being connected to each other at the outer ends of the cantilever beams of the two crimped portions which are adjacent to each other,
   said first film being between said cantilever beams of one of said crimped portions of each of said crimped connecting devices with said edge of said first film adjacent to said bight portion and with one of said conductors of said first film against one of said cantilever beams of said one crimped portion, said second film being between said cantilever beams of the other one of said crimped portions of each of said crimped connecting devices with said edge of said second film adjacent to said bight portion and with one of said conductors of said second film against one of said cantilever beams of said other crimped portion,
   said cantilever beams of each crimped portion being resiliently flexed against said films and being maintained in a flexed condition by said bight portions whereby,
said films are clamped between said cantilever beams of said crimped portions and said cantilever beams are resiliently maintained against, and in electrical contact with, said conductors and each of said conductors is in electrical contact with one of said electrical connecting devices.

2. The combination set forth in claim 1, each of said connecting devices having a contact means integral therewith and extending therefrom.

3. The combination set forth in claim 2, each of said contact means comprising a contact member extending laterally from the free end of one of said cantilever beams.

4. The combination set forth in either of claims 2 or 3 and insulating enclosing means, said enclosing means being in enclosing relationship to portions of said films and portions of said connecting devices.

5. The combination set forth in claim 4, said contact means extending externally of said enclosing means.

6. The combination set forth in claim 4, said enclosing means comprising a rigid molded housing.

7. The combination set forth in claim 2, and a rigid molded housing means, said housing means comprising folded sections, said portions of said films and said connecting devices being between said folded sections, said contact means extending externally of said housing means.

8. The combination set forth in claim 7, said contact means comprising contact pins, said contact pins extending through openings in one of said sections.

9. A continuous strip of stamped and formed electrical connecting devices which are intended to be crimped onto spaced apart conductors on first and second insulating films, said conductors on each film being spaced apart by a distance 2D, said films being in parallel planes with the conductors on said first film offset from the conductors on the second film, said strip comprising:
   a continuous carrier strip, said connecting devices being integral with said carrier strip and being spaced-apart by a distance D,
   each of said connecting devices comprising first and second crimp portions, each of said crimp portions being generally U-shaped and comprising a bight and cantilever beams extending from said bight, one of said cantilever beams of said first crimp portion being integral with said carrier strip at its end, the other cantilever beam of said first crimp portion being integral at its end with one cantilever beam of said second crimp portion whereby,
upon positioning said first film between said cantilever beams of said first crimp portions of said connecting devices on a section of said strip, positioning said second film between said cantilever beams of said second crimp portions of said connecting devices on said section of said strip with each of said connecting devices in alignment with one of said conductors, and upon thereafter crimping said connecting devices onto said films and removing said carrier strip from said connecting devices, an individual connecting device will be crimped onto each of said conductors.

10. A continuous strip of stamped and formed connecting devices as set forth in claim 9, each of said connecting devices having a contact portion extending therefrom which is dimensioned to be mated with a further conductor.

11. A continuous strip of stamped and formed connecting devices as set forth in claim 10, each of said contact portions comprising a contact post.